United States Patent
Ma et al.

(10) Patent No.: US 6,754,113 B2
(45) Date of Patent: Jun. 22, 2004

(54) TOPOGRAPHY CORRECTION FOR TESTING OF REDUNDANT ARRAY ELEMENTS

(75) Inventors: David Suitwai Ma, Cary, NC (US); Paul Edward Brucke, Durham, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/253,148

(22) Filed: Sep. 24, 2002

(65) Prior Publication Data

US 2004/0057296 A1 Mar. 25, 2004

(51) Int. Cl.⁷ ............................................... G11C 7/00
(52) U.S. Cl. ..................................... 365/200; 365/201
(58) Field of Search ................................. 365/200, 201

(56) References Cited

U.S. PATENT DOCUMENTS 6,097,644 A  *  8/2000  Shirley ........................ 365/200
2001/0046166 A1 * 11/2001 Fischer et al. .............. 365/200

* cited by examiner

Primary Examiner—Son Mai

(57) ABSTRACT

A data topography correction circuit for a semiconductor memory device and method for testing the device is provided. The data topography correction circuit includes a redundant hit circuit for determining if a redundant element has been used to replace a defective element; and a redundant topology correction scrambler circuit for converting data from a data topology of the defective element to a data topology of the redundant element. The method includes the steps of providing an address of a memory array element of the device to be tested; determining if the memory array element has been replaced with a redundant element; and, if the memory array element has been replaced, correcting test data to the data topology of the redundant element.

20 Claims, 3 Drawing Sheets

TOPOGRAPHY CORRECTION FOR TESTING OF REDUNDANT ARRAY ELEMENTS

BACKGROUND OF THE INVENTION

1. Field of the Invention

The present invention relates generally to semiconductor device design, and more particularly, to a device and method for testing memory arrays having redundant elements with different data topologies.

2. Description of the Related Art

Referring to FIG. 1, a conventional semiconductor memory device 100 includes a plurality of wordlines (WL) and a plurality of bitlines (BL) arranged to intersect the wordlines to form a memory cell array 102. Individual memory cells 104 are arranged at respective intersections of the wordlines and bitlines. A row decoder 106, a column decoder 108, and an input/output circuit 110 are provided in relation to the memory cell array 102. The row decoder 106 decodes a row address applied through an address input line 112 to select one of the wordlines, and applies a voltage to the selected wordline. The input/output circuit 110 includes a plurality of switching circuits each corresponding to a bitline pair (a true bitline BL and a complement bitline $\overline{BL}$), and one or a plurality of sense amplifiers disposed between an input/output line 114 and the switching circuits. The column decoder 108 decodes a column address applied through the address input line 112 to select one of the switching circuits. The input/output line 114 is connected to a data input/output pad (not shown) through an output driver circuit (not shown). Therefore, one memory cell 104 is selected by the row decoder 106 and the column decoder 108.

Arrays on memory devices usually require the usage of redundant array elements to fix any processing manufacturing defects to increase yield, i.e., redundant memory elements will replace defective memory elements to enable repairablity of the array. These redundant memory elements may include redundant rows/redundant wordlines RWL or spare column select lines CSL. For example, a column replacement is usually accomplished by four pairs of bitlines that are accessed by the same column select line CSL. These redundant elements increase the layout complexity of the semiconductor memory device. Furthermore, array architecture complexity increases with the usage of Bit Line (BL) twisting schemes (see FIG. 1 "TWIST") and layout mirroring/packaging schemes.

These increases in complexity will either cause data topologies between redundant elements and the replaced defective elements to be different sometimes or it will limit the possible replacement candidates that a defective element could be replaced with. The data topology determines how a memory cell will store a particular value. For example, a memory cell can represent a logical "1" by storing either a positive or use charge (similar to a logical "0"). What determines whether a logical "1" is stored as a positive or "0" charge, is by how the sense amplifier is connected to the memory cell. If the memory cell is on a true bitline BL, a positive charge will be stored and, if the memory cell is on a complement bitline $\overline{BL}$, a "0" charge will be stored.

Having a different data topology after being repaired will not affect the normal functionality of the memory device. However, it may cause reduced test coverage or hard to analyze results during post-fuse testing. For example, if a complement redundant wordline $\overline{RWL}$ is used to replace a defective true wordline WL, when testing for retention fail of solid "1" data, the complement redundant wordline $\overline{RWL}$ and redundant memory cell 116 will have physical "0" stored and it will not be truly tested for retention.

SUMMARY OF THE INVENTION

Accordingly, it is an aspect of the present invention to provide a data topography correction circuit for a semiconductor memory device including a redundant hit circuit for determining if a redundant element has been used to replace a defective element of the semiconductor memory device; and a redundant topology correction scrambler circuit for converting data from a data topology of the defective element to a data topology of the redundant element. The redundant hit circuit is adapted to compare a memory element address to repair fuse information to determine if addressed memory element has been replaced with a redundant element.

The data topography correction circuit further includes a first multiplexer for multiplexing corrected data with raw data to a memory array of the semiconductor memory device upon a write operation; and a second multiplexer for multiplexing corrected data with raw data to an off-chip driver from the semiconductor memory device upon a read operation.

According to another aspect of the present invention, a semiconductor memory device is provided. The semiconductor memory device includes a memory cell array including a plurality of memory elements and a plurality of redundant memory elements; and a data topography correction circuit including a redundant hit circuit for determining if a redundant memory element has been used to replace a defective memory element of the semiconductor memory device; and a redundant topology correction scrambler circuit for converting data from a data topology of the defective memory element to a data topology of the redundant memory element. The semiconductor memory device further includes a first multiplexer for multiplexing corrected data with raw data to a memory array of the semiconductor memory device upon a write operation; and a second multiplexer for multiplexing corrected data with raw data to an off-chip driver from the semiconductor memory device upon a read operation.

According to a further aspect of the present invention, a method for testing a semiconductor memory device includes the steps of applying a test mode signal to place the semiconductor memory device in a test mode; providing an address of a memory array element of the semiconductor memory device to be tested; determining if the memory array element has been replaced with a redundant element; and if the memory array element has been replaced, correcting test data to a data topology of the redundant element.

According of another aspect of the present invention, the method further includes the step of comparing the address of the memory array to repair fuse information to determine if the memory array element has been replaced with a redundant element.

Furthermore, the method can be performed during a write or read operation.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

Preferred embodiments of the present invention will be described herein below with reference to the accompanying drawings. In the following description, well-known functions or constructions are not described in detail since they would obscure the invention in unnecessary detail.

The present invention is directed to a data topography correction circuit and method for using same. The data topography correction circuit can be implemented on the die of semiconductor device, e.g., a semiconductor memory device, and will be activated during post-fuse testing. Whenever a redundant element is addressed by an external tester, the data topography correction circuit will transform the data which is topological correct for the defective normal array element and replace it with the topological correct data for the redundant array element for writing into the array. When reading out of the array, the inverse operation will be performed.

Figure 1:
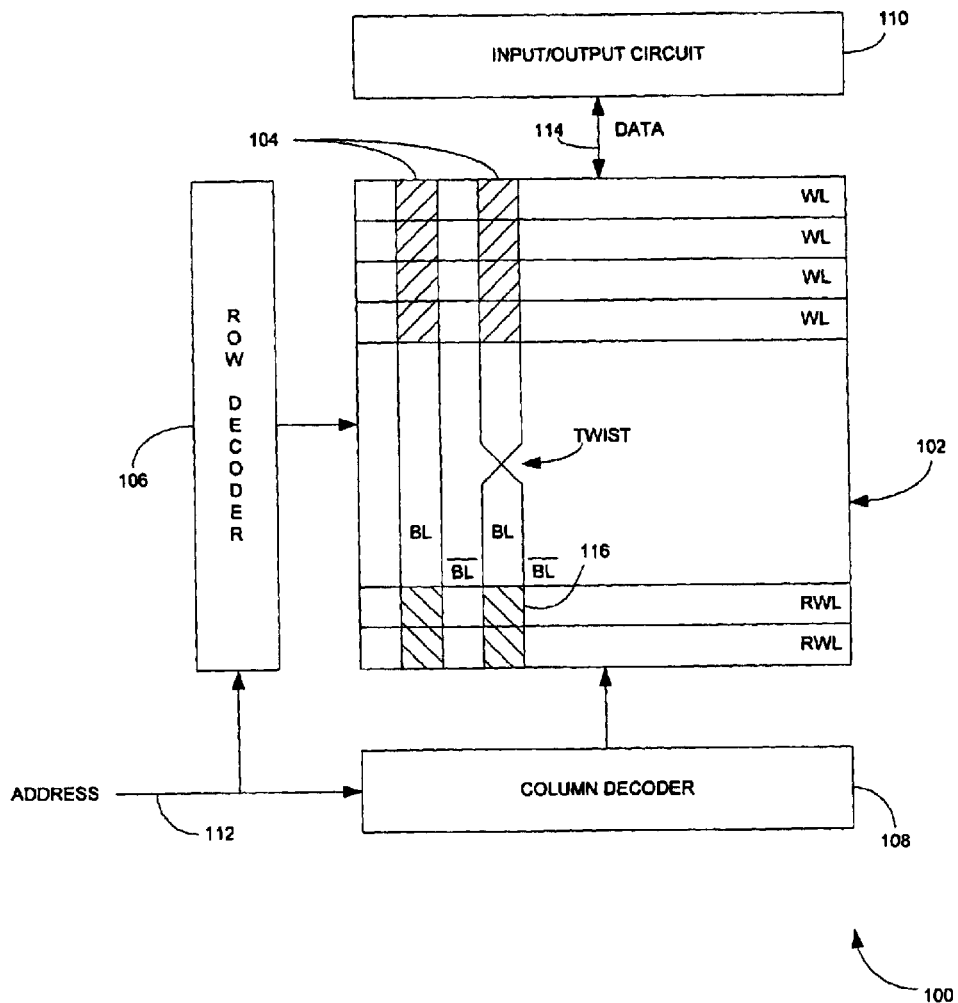
FIG. 1 is a block diagram of a conventional semiconductor memory device.
Figure 2:
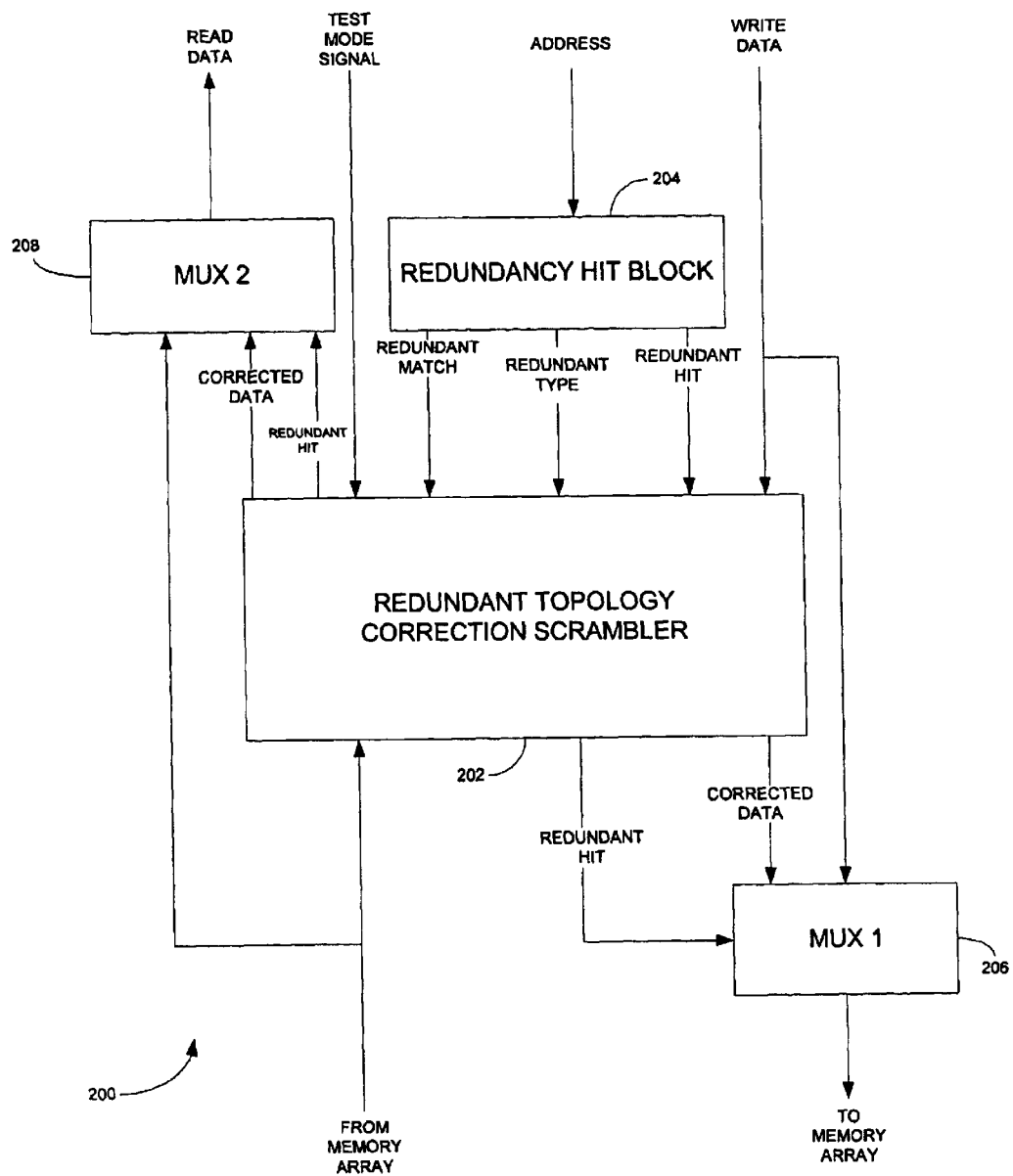
FIG. 2 is a block diagram of a data topography correction circuit for use with a semiconductor memory device in accordance with the present invention.

Referring to FIG. 2, a data topography correction circuit 200 for testing of redundant array elements of a memory device is provided. The data topography correction circuit 200 includes a redundant topology correction scrambler circuit 202 for correcting or converting data to a data topology of a redundant element and a redundancy hit block 204 for determining if a redundancy element has been used to repair a defective memory element. The data topography correction circuit 200 further includes a first multiplexer 206 for multiplexing corrected data with raw data during a write operation and a second multiplexer 208 for multiplexing corrected data with raw data during a read operation.

Figure 3:
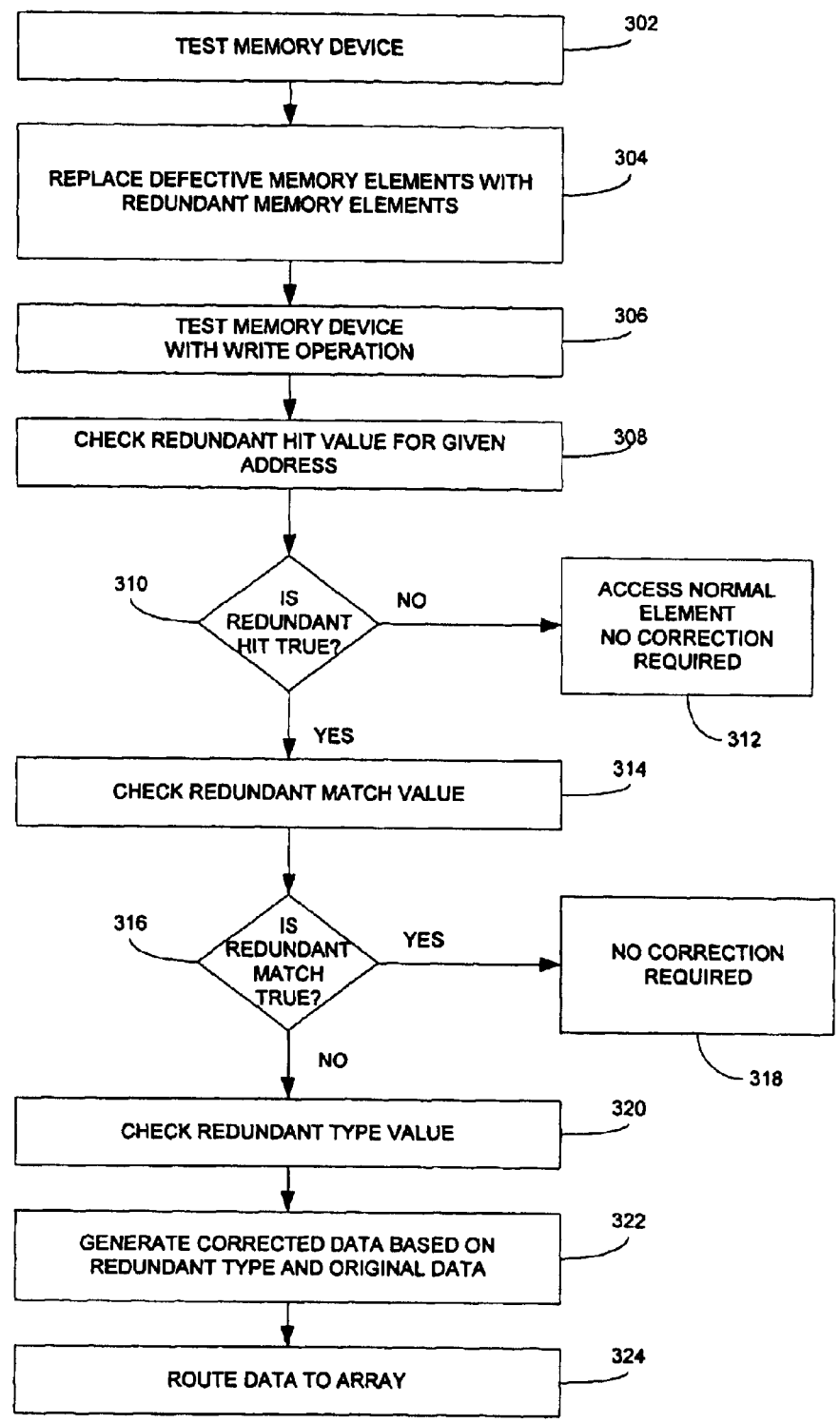
FIG. 3 is a flowchart illustrating a method for correcting data topologies of redundant elements of a semiconductor memory device in accordance with the present invention.

Referring to FIGS. 2 and 3, the data topology correction circuit will be described in more detail in conjunction with its method of use. Initially, in step 302, a device under test (DUT), e.g., a dynamic random memory access memory (DRAM) device, is tested for defective memory elements by applying a test mode signal to the DUT. If any elements are determined to be defective, the defective elements are replaced with redundant memory elements by any of the various known repair methods, for example, a fuse repair method (step 304). In the conventional fuse repair method, a table will be generated during the initial testing, which is then analyzed to determine what is the best way, e.g., most efficient way, to repair the memory array. Fuses are then blown to enable redundant elements to repair the memory array.

Once the DUT has been repaired, i.e., the defective memory elements have been replaced, the DUT is subjected to a post-fuse test by subjecting it to a write operation (step 306). At the initiation of the post-fuse test, the test mode signal is applied to the redundant topology correction scrambler circuit 202, an address of the memory cell to be written to is applied to the redundancy hit block 204, and the data to be written is applied to the redundant topology correction scrambler circuit 202 and the first multiplexer 206.

In step 308, the redundancy hit block 204 determines for the given address if a redundant memory element was used or if the address is accessing a normal element. The redundancy hit block 204 determines if a redundant elements was used by comparing the incoming address to the fuse setting information generated during the initial test. If a redundant memory element was used, a redundant hit signal will be true (step 310) and the redundant hit signal, a redundant match signal and a redundant type signal will be sent to the redundant topology correction scrambler circuit 202. If a redundant memory element was not used and correction is not required, the redundant hit signal will be false and will be sent to the first multiplexer 206 to allow the original raw data to pass through the multiplexer 206 and to be written to the intended memory cell of the memory array (step 312).

Referring back to step 310, if the redundant hit signal was true, data topology correction is required as follows. In step 314, the redundant topology correction scrambler circuit 202 checks the redundant match signal. If the redundant match signal is true (step 316), it means the redundant and replaced elements have the same data topology and the incoming data is passed to the memory array without any correction (step 318). Otherwise, if the redundant match signal is false (step 316), it is determined that the redundant and replaced elements have different data topologies and correction is required. The redundant type signal is checked (step 320) to determine the data topology of the redundant element used for the desired address. In step 322, corrected data is generated based on the original inputted data and the redundant type signal. Preferably, the correction will be performed be an XOR or XNOR logic gate. The corrected data is then sent to the first multiplexer 206 to route the corrected data to the memory array (step 324).

Although the above description describes data topography correction during a write operation to a memory array, it is to be appreciated by one skilled in the art that the reverse operation will be required to read the proper data from the memory array. For example, at the initiation of the post-fuse test, the test mode signal is applied to the redundant topology correction scrambler circuit 202, an address of the memory cell to be read from is applied to the redundancy hit block 204, and the data to be read is retrieved from the memory array to the redundant topology correction scrambler circuit 202 and the second multiplexer 208. The redundancy hit block 204 determines for the given address if a redundant memory elements was used or if the address read from is a normal element. If a redundant memory element was used, a redundant hit signal will be true and the redundant hit signal, a redundant match signal and a redundant type signal will be sent to the redundant topology correction scrambler circuit 202. If a redundant memory element was not used and correction is not required, the redundant hit signal will be false and will be sent to the second multiplexer 208 to allow the read data to pass through the multiplexer 208 and to be sent to an off-chip driver and/or an external tester.

Furthermore, if the redundant hit signal was true, the redundant topology correction scrambler circuit 202 checks the redundant match signal. If the redundant match signal is true, it means the redundant and replaced elements have the same topology and the outgoing data is passed to the second multiplexer 208 without any correction. Otherwise, if the redundant match signal is false, it is determined that the redundant and replaced elements have different topology and correction is required. The redundant type signal is checked to determine the topology of the redundant element used for the desired address. Corrected data is generated based on the data read and the redundant type signal. The corrected data is then sent to the second multiplexer 208 to route the corrected data to an off-chip driver and/or an external tester.

It is to be appreciated that a single data topology correction circuit is required for the entire memory array and will be manufactured on the die of the memory device. The redundant topology correction scrambler circuit will be located along a data path of the memory device and, preferably, along the data path in between the sense amplifiers and the memory array. Additionally, the redundancy hit block can be located anywhere the fuse information and incoming addresses are accessible.

While the invention has been shown and described with reference to a certain preferred embodiment thereof, it will be understood by those skilled in the art that various changes in form and detail may be made therein without departing from the spirit and scope of the invention as defined by the appended claims.

What is claimed is:

1. A data topography correction circuit for a semiconductor memory device comprising:
   a redundant hit circuit for determining if a redundant element has been used to replace a defective element of the semiconductor memory device; and
   a redundant topology correction scrambler circuit for converting data from a data topology of the defective element to a data topology of the redundant element.

2. The data topography correction circuit as in claim 1, wherein the redundant hit circuit is adapted to compare a memory element address to repair fuse information to determine if addressed memory element has been replaced with a redundant element.

3. The data topography correction circuit as in claim 1, wherein the redundant topology correction scrambler circuit is adapted to determine if the data topology of the redundant element is the same as the data topology of the defective element, wherein if the data topologies are the same, the redundant topology correction scrambler circuit allows incoming data to pass through.

4. The data topography correction circuit as in claim 3, wherein if the data topologies are different, the redundant topology correction scrambler circuit determines the data topology of the redundant element.

5. The data topography correction circuit as in claim 1, further comprising a multiplexer for multiplexing corrected data with raw data to a memory array of the semiconductor memory device upon a write operation.

6. The data topography correction circuit as in claim 1, further comprising a multiplexer for multiplexing corrected data with raw data to an off-chip driver from the semiconductor memory device upon a read operation.

7. The data topography correction circuit as in claim 1, further comprising
   a first multiplexer for multiplexing corrected data with raw data to a memory array of the semiconductor memory device upon a write operation; and
   a second multiplexer for multiplexing corrected data with raw data to an off-chip driver from the semiconductor memory device upon a read operation.

8. A semiconductor memory device comprising:
   a memory cell array including a plurality of memory elements and a plurality of redundant memory elements; and
   a data topography correction circuit including:
   a redundant hit circuit for determining if a redundant memory element has been used to replace a defective memory element of the semiconductor memory device; and
   a redundant topology correction scrambler circuit for converting data from a data topology of the defective memory element to a data topology of the redundant memory element.

9. The semiconductor memory device as in claim 8, wherein the redundant hit circuit is adapted to compare a memory element address to repair fuse information to determine if addressed memory element has been replaced with a redundant memory element.

10. The semiconductor memory device as in claim 8, wherein the redundant topology correction scrambler circuit is adapted to determine if the data topology of the redundant memory element is the same as the data topology of the defective memory element, wherein if the data topologies are the same, the redundant topology correction scrambler circuit allows incoming data to pass through.

11. The semiconductor memory device as in claim 10, wherein if the data topologies are different, the redundant topology correction scrambler circuit determines the data topology of the redundant memory element.

12. The semiconductor memory device as in claim 8, further comprising a multiplexer for multiplexing corrected data with raw data to a memory array of the semiconductor memory device upon a write operation.

13. The semiconductor memory device as in claim 8, further comprising a multiplexer for multiplexing corrected data with raw data to an off-chip driver from the semiconductor memory device upon a read operation.

14. The semiconductor memory device as in claim 8, further comprising
   a first multiplexer for multiplexing corrected data with raw data to a memory array of the semiconductor memory device upon a write operation; and
   a second multiplexer for multiplexing corrected data with raw data to an off-chip driver from the semiconductor memory device upon a read operation.

15. A method for testing a semiconductor memory device, the method comprising the steps of:
   applying a test mode signal to place the semiconductor memory device in a test mode;
   providing an address of a memory array element of the semiconductor memory device to be tested;
   determining if the memory array element has been replaced with a redundant element; and
   if the memory array element has been replaced, correcting test data to a data topology of the redundant element.

16. The method as in claim 15 wherein said test mode is a pre-fuse test mode, the method further comprising the steps of:
   determining if any memory array elements are defective; and
   replacing defective memory array elements with redundant elements.

17. The method as in claim 15, wherein the determining if the memory array element has been replaced with a redundant element step further comprises the step of comparing the address of the memory array to repair fuse information.

18. The method as in claim 15, further comprising the step of, if the memory array element has been replaced, determining if the redundant element has a same data topology as the memory array element.

19. The method as in claim 15, wherein the providing an address of a memory array element of the semiconductor memory device to be tested is performed during a write operation.

20. The method as in claim 15, wherein the providing an address of a memory array element of the semiconductor memory device to be tested is performed during a read operation.

* * * * *